United States Patent
Kanai et al.

(10) Patent No.: US 10,892,748 B1
(45) Date of Patent: Jan. 12, 2021

(54) POWER MODULE

(71) Applicant: SHARP KABUSHIKI KAISHA, Sakai (JP)

(72) Inventors: Hiroki Kanai, Sakai (JP); Tomotoshi Satoh, Sakai (JP); Koichiro Fujita, Sakai (JP); Kenichi Tanaka, Sakai (JP); Hiroyuki Komeda, Sakai (JP); Naomichi Fujii, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/920,687

(22) Filed: Jul. 4, 2020

(30) Foreign Application Priority Data

Jul. 8, 2019 (JP) .................. 2019-127027

(51) Int. Cl.
*H03K 17/16* (2006.01)
*H01L 23/498* (2006.01)
*H01L 23/50* (2006.01)

(52) U.S. Cl.
CPC ....... *H03K 17/16* (2013.01); *H01L 23/49822* (2013.01); *H01L 23/49844* (2013.01); *H01L 23/50* (2013.01)

(58) Field of Classification Search
CPC .............. H03K 17/16; H01L 23/49822; H01L 23/49844; H01L 23/50
USPC .... 327/108–112, 427, 434, 437; 326/82, 83, 326/87
See application file for complete search history.

(56) References Cited

U.S. PATENT DOCUMENTS

| 5,729,048 A * | 3/1998 | Tatsuoka | H01L 23/50 257/208 |
| 6,353,353 B1 * | 3/2002 | Nakayama | H01L 23/522 327/382 |
| 2006/0192599 A1 * | 8/2006 | Haerle | B60R 21/017 327/108 |
| 2016/0043720 A1 * | 2/2016 | Kubota | H03K 17/6874 327/109 |

FOREIGN PATENT DOCUMENTS

JP 2013-141035 A 7/2013

OTHER PUBLICATIONS

"GN001 Application Guide Design with GaN Enhancement mode HEMT" Updated on Apr. 12, 2018 GaN Systems Inc. (p. 40).

* cited by examiner

*Primary Examiner* — Tomi Skibinski
(74) *Attorney, Agent, or Firm* — ScienBiziP, P.C.

(57) ABSTRACT

A power module includes a power circuit which includes one or more power semiconductors; and a control circuit which supplies a gate signal to each of the one or more power semiconductors. The control circuit includes one or more gate drivers which generate the gate signal in accordance with a control signal and in which a side to which the control signal is input and a side on which the gate signal is generated are insulated, a control input circuit to which the control signal is input and which supplies the control signal to the one or more gate drivers, and a control output circuit which supplies the gate signal to each of the power semiconductors.

7 Claims, 9 Drawing Sheets

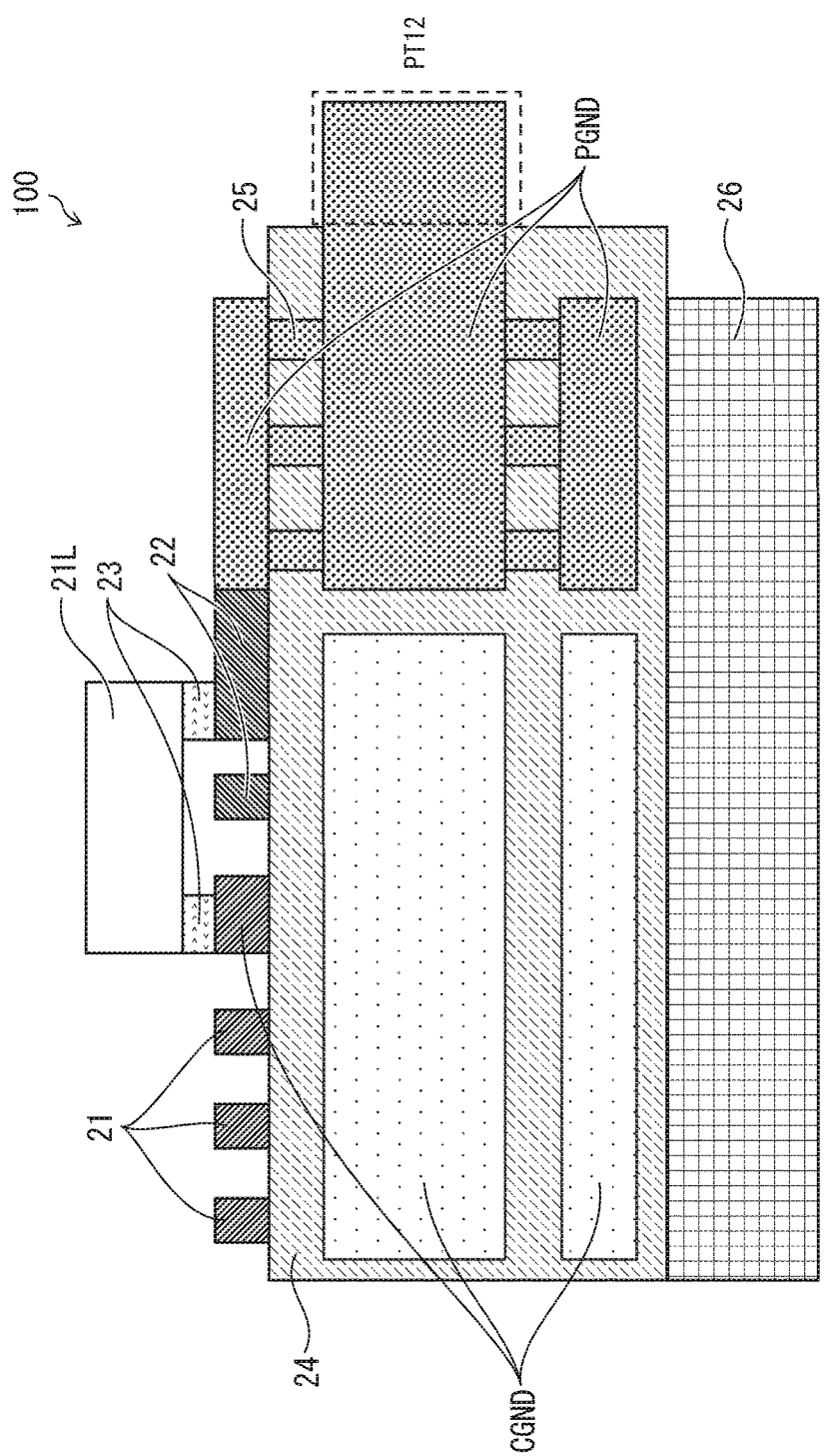

FIG.3

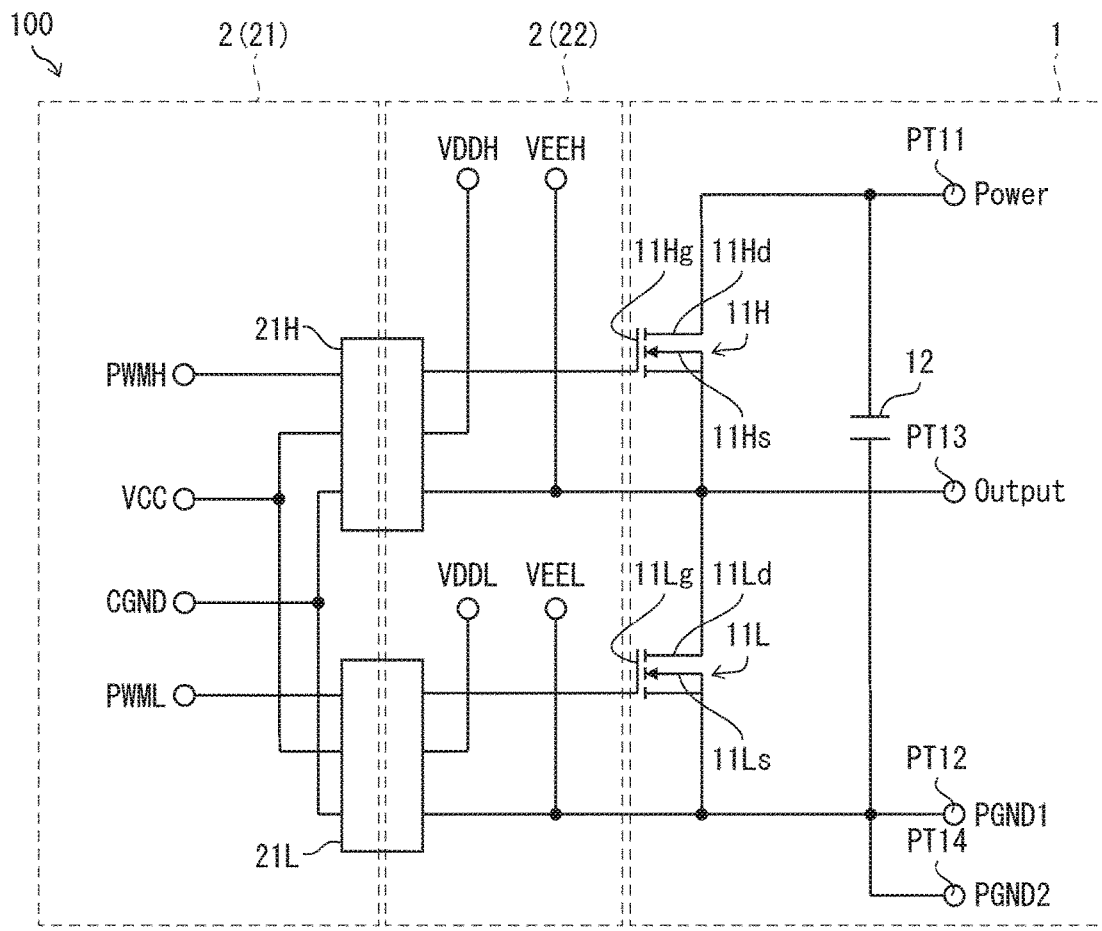

| | |
|---|---|
| 1: POWER CIRCUIT | PT14: FOURTH POWER TERMINAL |
| 2: CONTROL CIRCUIT | PWMH: Hi-side CONTROL SIGNAL |
| 11H: Hi-side POWER SEMICONDUCTOR | PWML: Lo-side CONTROL SIGNAL |
| 11L: Lo-side POWER SEMICONDUCTOR | VCC: CONTROL INPUT POWER SOURCE |
| 11Hs, 11Ls: SOURCE ELECTRODE | CGND: CONTROL INPUT GND |
| 11Hg, 11Lg: GATE ELECTRODE | VDDH: Hi-side CONTROL OUTPUT POWER SOURCE |
| 11Hd, 11Ld: DRAIN ELECTRODE | VEEH: Hi-side CONTROL OUTPUT GND |
| 21: CONTROL INPUT CIRCUIT | VDDL: Lo-side CONTROL OUTPUT POWER SOURCE |
| 21H: Hi-side GATE DRIVER | VEEL: Lo-side CONTROL OUTPUT GND |
| 21L: Lo-side GATE DRIVER | Power: POWER INPUT |
| 22: CONTROL OUTPUT CIRCUIT | Output: POWER OUTPUT |
| 100: POWER MODULE | PGND1: FIRST POWER GND |
| PT11: FIRST POWER TERMINAL | PGND2: SECOND POWER GND |
| PT12: SECOND POWER TERMINAL | |
| PT13: THIRD POWER TERMINAL | |

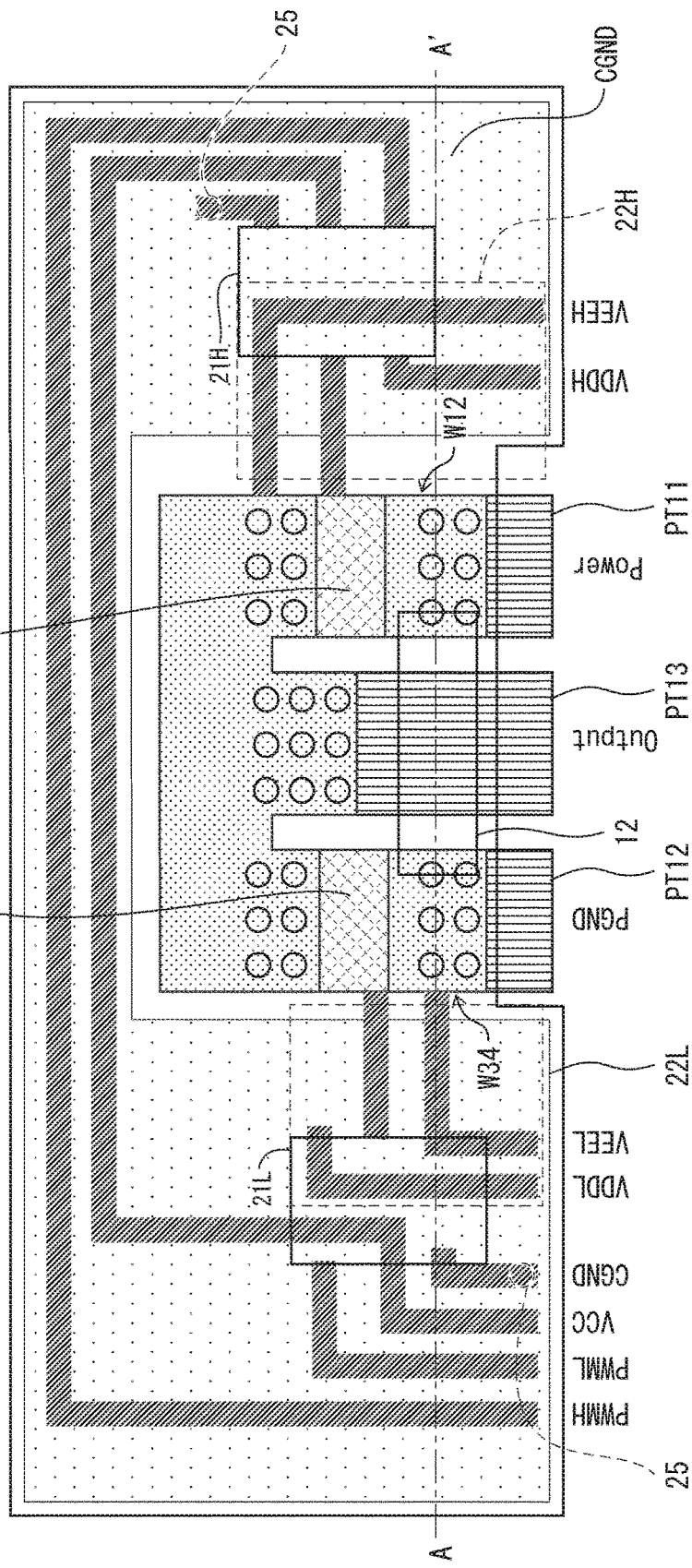

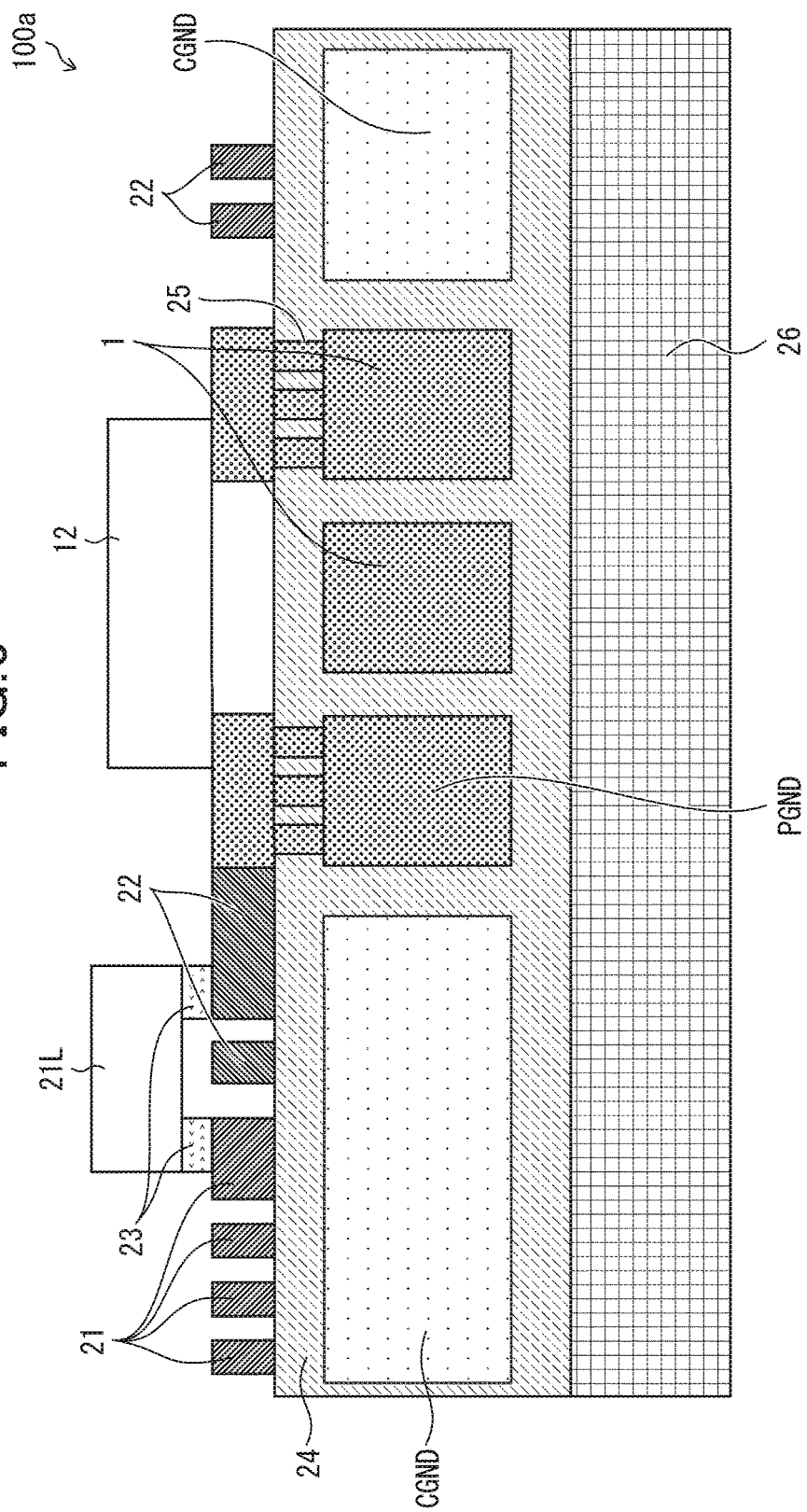

11H: Hi-side POWER SEMICONDUCTOR
11L: Lo-side POWER SEMICONDUCTOR
12: BYPASS CAPACITOR
100b: POWER MODULE
22H: CONTROL OUTPUT CIRCUIT (Hi-side)
22L: CONTROL OUTPUT CIRCUIT (Lo-side)
F1: FIRST DIRECTION
PT11: FIRST POWER TERMINAL
PT12: SECOND POWER TERMINAL
PT13: THIRD POWER TERMINAL W1: FIRST WIRE PORTION
W2: SECOND WIRE PORTION
W3: THIRD WIRE PORTION
W4: FOURTH WIRE PORTION
W12: FIRST WIRE
W34: SECOND WIRE

US 10,892,748 B1

POWER MODULE

CROSS-REFERENCE TO RELATED APPLICATIONS

This application claims the benefit of priority to Japanese Patent Application Number 2019-127027 filed on Jul. 8, 2019. The entire contents of the above-identified application are hereby incorporated by reference.

BACKGROUND

The present disclosure relates to a power module.

TECHNICAL FIELD

In these years, further improvement in switching speed has been demanded for development of a power module. However, high-speed switching causes a possibility that noise is transferred from a power circuit to a control circuit at a time of switching. Japanese Patent Application Publication No. 2013-141035 discloses a configuration in which a path for driving a high-side switch gate and a main current path are separated.

Moreover, in "GN001 Application Guide Design with GaN Enhancement mode HEMT" Updated on Apr. 12, 2018 GaN Systems Inc. (p. 40), the following configuration is reported. That is, a configuration that is constituted by a control input circuit to which a control signal is input, a control output circuit which controls a gate voltage of a power semiconductor on the basis of the input signal, and a power circuit which inputs/outputs a current to the power semiconductor is described.

Moreover, in the configuration described in "GN001 Application Guide Design with GaN Enhancement mode HEMT" Updated on Apr. 12, 2018 GaN Systems Inc. (p. 40), a control GND is arranged at a position in a second layer, which faces (is immediately under) the control input circuit of a first layer via an insulating layer. A pattern (control output GND (Hi)) connected to SW potential is arranged immediately under a Hi-side control output circuit. Moreover, a pattern (control output GND (Lo)) connected to a power GND is arranged immediately under a Lo-side control output circuit.

However, in the configuration of a semiconductor device disclosed in Japanese Unexamined Patent Application Publication No. 2013-141035, a source electrode of a MOSFET and a source electrode of a driver circuit have the same potential due to metal wiring, so that there is a possibility that transfer of noise to a control circuit is caused by potential fluctuation of a power GND.

Moreover, in "GN001 Application Guide Design with GaN Enhancement mode HEMT" Updated on Apr. 12, 2018 GaN Systems Inc. (p. 40), potential of the power GND fluctuates at a time of switching of the power semiconductor, so that there is a possibility that noise is transferred to the control output circuit due to induced electromotive force. In other words, there is a possibility that noise of the power GND is transferred to the control output circuit that is arranged at a position to face the power GND in a different layer via an insulating material.

SUMMARY

According to an aspect of the disclosure, transfer of noise, which is generated due to potential fluctuation of a power GND, to a control output circuit of a control circuit at a time of switching is suppressed.

A power module according to an aspect of the disclosure includes: a power circuit which includes one or more power semiconductors; and a control circuit which supplies a gate signal to each of the one or more power semiconductors. The control circuit includes: one or more gate drivers which generate the gate signal in accordance with a control signal and in which a side to which the control signal is input and a side on which the gate signal is generated are insulated; a control input circuit to which the control signal is input and which supplies the control signal to the one or more gate drivers; and a control output circuit which supplies the gate signal to each of the power semiconductors. A ground of the power circuit and a ground of the control circuit are separated, and at least a part of the control output circuit of the control circuit and the ground of the control circuit are arranged at respective positions to face each other in different layers with an insulating layer interposed therebetween.

BRIEF DESCRIPTION OF THE DRAWINGS

FIG. 2 is a sectional view taken along a line II-II of FIG. 1;

FIG. 3 is a circuit diagram illustrating an example of the configuration of the power module in FIG. 1;

FIG. 5 is an explanatory view illustrating a configuration example of a power module according to Embodiment 2 of the disclosure;

FIG. 6 is a sectional view taken along a line VI-VI of FIG. 5;

DESCRIPTION OF THE EMBODIMENTS

Embodiment 1

An embodiment of the disclosure will be described as follows. Hereinafter, for convenience of description, a constituent having the same function as that of a constituent described in a specific embodiment will be given the same reference sign and description thereof will be omitted in some cases.

Configuration Example of Power Module

Figure 1:
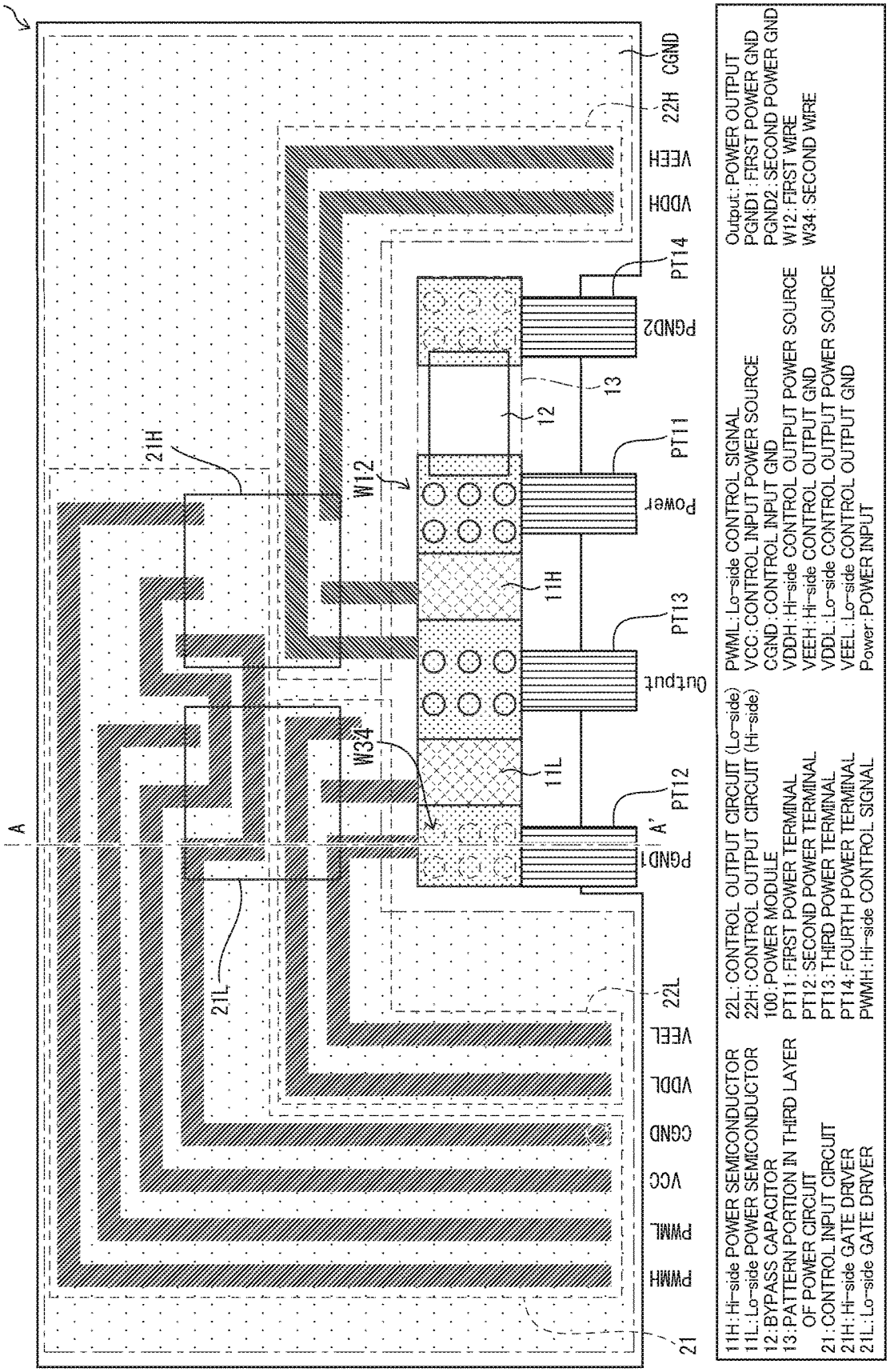
FIG. 1 is an explanatory view illustrating a configuration example of a power module according to Embodiment 1 of the disclosure.

FIG. 1 is an explanatory view illustrating a configuration example of a power module 100 according to the present embodiment, FIG. 2 is a sectional view taken along a line II-II of FIG. 1, and FIG. 3 is a circuit diagram illustrating an example of the configuration of the power module 100 in FIG. 1.

First, as illustrated in FIG. 3, the power module 100 includes a power circuit 1 and a control circuit 2. The power circuit 1 includes one or more power semiconductors (in exemplification of FIG. 3, a High-side (referred to as "Hi-side" hereinafter) power semiconductor 11H and a Low-side (referred to as "Lo-side" hereinafter) power semiconductor 11L are included, and are generically called power semiconductors 11 in the present specification in some cases, when not being particularly distinguished). The control circuit 2 includes a control input circuit 21 and a control output circuit 22.

The power circuit 1 inputs/outputs a current to the Hi-side power semiconductor 11H and the Lo-side power semiconductor 11L, for example. The control circuit 2 supplies a gate signal to each of the one or more power semiconductors 11. Specifically, the control circuit 2 controls a gate voltage of each of the power semiconductors 11.

In the present embodiment, a "ground" is described also as a "GND". Moreover, in FIG. 3, a reference sign of PWMH denotes a Hi-side control signal, PWML denotes a Lo-side control signal, VCC denotes a control input power source, CGND (Control Ground) denotes a control input GND, and PGND (Power Ground) denotes a power GND (the same applies hereafter).

Moreover, VDDH denotes a Hi-side control output power source, VEEH denotes a Hi-side control output GND, VDDL denotes a Lo-side control output power source, and VEEL denotes a Lo-side control output GND.

Further, Power denotes a power input, Output denotes a power output, PGND1 denotes a first PGND, and PGND2 denotes a second PGND. In addition, the first PGND and the second PGND are generically called PGNDs in some cases, when not being distinguished.

Although details will be described later, as illustrated in FIG. 3, the PGND1 and the PGND2 are separated from the CGND. Moreover, as illustrated in FIG. 2, at least a part of the control output circuit 22 of the control circuit 2 and the CGND are arranged at respective positions to face each other in different layers via an insulating layer 24.

The power semiconductor 11 is configured by, for example, GaN or the like. Moreover, as illustrated in FIG. 3, a bypass capacitor 12 (also refer to FIG. 1) connects the Power (first power terminal described below) and the PGND1 (second power terminal described below) (PGND2 (fourth power terminal described below)). Details of the bypass capacitor 12 will be described later.

In the Hi-side power semiconductor 11H and the Lo-side power semiconductor 11L in the power circuit 1 according to the present embodiment, for example, at a time of turn-on of the Hi-side power semiconductor 11H, a voltage near 400 V is subjected to a switching operation. On the other hand, in the above-described control circuit 2 that supplies a gate signal to the Hi-side power semiconductor 11H and the Lo-side power semiconductor 11L, a turn-on voltage is, for example, 1 V.

In the power circuit 1 in which the voltage near 400 V is subjected to the switching operation, potential fluctuation of the PGND (the PGND1, the PGND2) at a time of switching of the power semiconductor 11 is great. When the potential fluctuation of the PGND is great, noise generated due to the potential fluctuation of the PGND at the time of switching of the power semiconductor 11 is easily transferred to the CGND of the control circuit 2, so that there is a possibility that a gate signal of the control circuit 2 causes erroneous turn-on of the power semiconductor 11.

Moreover, for example, when GaN is used for the power semiconductor 11, the above-described potential fluctuation of the PGND at the time of switching of the power semiconductor 11 tends to become greater due to high-speed switching of the power semiconductor 11.

Comparative Example

Figure 9:
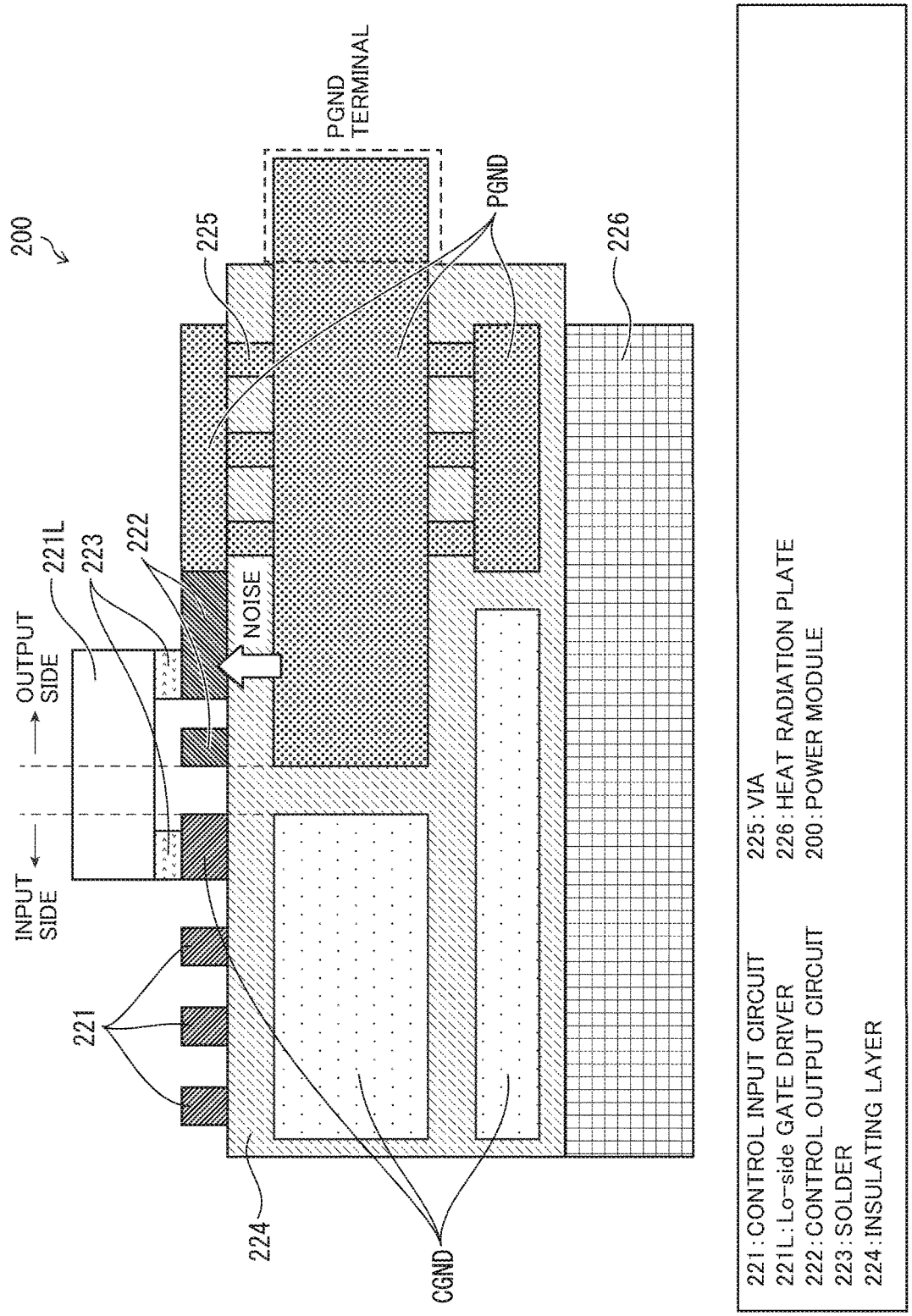
FIG. 9 is a sectional view illustrating a configuration example of a power module of a comparative example.

FIG. 9 is a sectional view illustrating a configuration example of a power module 200 according to a comparative example. In the general power module 200 illustrated in FIG. 9, a control circuit (including a control input circuit 221 and a control output circuit 222 and the same applies hereafter) is provided with a gate driver 221L that insulates an input side and an output side, and a PGND and a CGND in a second layer of the power module 200 are configured so as to match with the input side and the output side (so as to match with the gate driver 221L) in a first layer. However, as described above, in a case where potential fluctuation of the PGND at a time of switching of a power semiconductor is great, even when the gate driver 221L that insulates the input side and the output side is included, there is a possibility that noise is transferred from the PGND of the second layer to the control circuit (control output circuit 222) on the output side of the first layer and a gate signal of the control circuit causes erroneous turn-on of the power semiconductor.

Effect of Embodiment 1

According to the aforementioned configuration, in the present embodiment, the PGND1 and the CGND are separated, and at least a part of the control output circuit 22 of the control circuit 2 and the CGND are arranged at the respective positions to face each other in the different layers via the insulating layer 24, so that it is possible to suppress transfer of noise, which is generated due to the potential fluctuation of the PGND, to the control output circuit 22 of the control circuit 2 at the time of switching.

Therefore, with the configuration of the power module 100 according to the present embodiment, since the CGND and a part of the control output circuit 22 face each other in the different layers via the insulating layer 24, an effect of suppressing transfer of noise from the PGND to an output side (control output circuit 22) is exerted.

Configuration Example of Power Module

Next, the configuration of the power module 100 will be described in detail with reference to FIGS. 1 and 2. As described above, the control circuit 2 includes the control input circuit 21 and the control output circuit 22. Moreover, as illustrated in FIGS. 1 to 3, the control circuit 2 includes one or more gate drivers (in exemplification, a Hi-side gate driver 21H and a Lo-side gate driver 21L).

The gate driver generates the aforementioned gate signal in accordance with a control signal (PWMH, PWML). The control signal (PWMH, PWML) is input to the control input circuit 21, and the control input circuit 21 supplies the control signal to the one or more gate drivers. The control output circuit 22 supplies the aforementioned gate signal to the power semiconductor 11.

Moreover, in the power circuit 1, as illustrated in FIGS. 1 and 3, the Hi-side power semiconductor 11H is connected between a third power terminal PT13 and the first power terminal PT11, and includes a source electrode 11Hs, a gate electrode 11Hg, and a drain electrode 11Hd.

On the other hand, the Lo-side power semiconductor 11L is connected between the third power terminal PT13 and the second power terminal PT12, and includes a source electrode 11Ls, a gate electrode 11Lg, and a drain electrode 11Ld. Moreover, as illustrated in FIG. 3, the Hi-side power semiconductor 11H and the Lo-side power semiconductor 11L are transistors.

Moreover, As illustrated in FIG. 3, the source electrode 11Hs of the Hi-side power semiconductor 11H is connected to the third power terminal PT13, the gate electrode 11Hg is connected to the Hi-side gate driver 21H, and the drain electrode 11Hd is connected to the first power terminal PT11.

On the other hand, the source electrode 11Ls of the Lo-side power semiconductor 11L is connected to the second power terminal PT12, the gate electrode 11Lg is connected to the Lo-side gate driver 21L, and the drain electrode 11Ld is connected to the third power terminal PT13.

In addition, in FIG. 1, a reference sign of W12 denotes a first wire and a reference sign of W34 denotes a second wire. Details of the first wire W12 and the second wire W34 will be described with reference to FIG. 8 in Embodiment 3.

Further, as illustrated in FIG. 3, by using a gate driver, in which the control input circuit 21 and the control output circuit 22 are insulated, for the gate driver which controls the power semiconductor 11 and examples of which are the Hi-side gate driver 21H and the Lo-side gate driver 21L, a power side and a control side may be separated in terms of noise.

Moreover, a reference sign of 13 (part surrounded by a one-dot chain line) in FIG. 1 denotes a pattern portion of the power circuit in a third layer (layer on a deepest side in FIG. 1).

Further, as described above, reference signs of PT11 to PT14 in FIG. 1 respectively denote the first to fourth power terminals, that is, the power terminals which respectively correspond to the Power, the PGND1, the Output, and the PGND2 of the power circuit 1.

Moreover, in the power module 100 illustrated in FIG. 1, since potential of the PGND fluctuates at the time of switching of the power semiconductor, even when a PGND pattern is arranged on a counter surface of the control output circuit 22, the potential is not stabilized. Then, in the present embodiment, the CGND is arranged on a counter surface of at least a part of the control output circuit 22.

In addition, when a size of the CGND is sufficiently large, it is possible to suppress transfer of influence of noise in the control output circuit 22 to the control input circuit 21 through the CGND at the time of switching.

Going back to FIG. 2, description will be continued. As described above, FIG. 2 is the sectional view taken along the line II-II of FIG. 1. As illustrated in FIG. 2, in the present embodiment, substrate wiring of the power module 100 has, for example, a three-layer structure. The insulating layer 24 is provided in each space between layers.

Moreover, in a lowest part in FIG. 2, a heat radiation plate 26 that radiates heat generated by the power module 100 to an outside is provided. The heat radiation plate 26 will be described later. A third layer of the power module 100 is joined to an upper surface of the heat radiation plate 26 via the insulating layer. As illustrated in FIGS. 1 and 2, the CGND is provided in a range overlapping with both the control input circuit 21 and the control output circuit 22.

On the other hand, as illustrated in FIGS. 1 and 2, the PGND is provided in a range overlapping with the power circuit 1. Moreover, in the present embodiment, for example, a structure in which a fine pattern portion is provided in the first layer of the power circuit 1 and a large current flows in the second layer may be provided. The control input circuit 21 and the control output circuit 22 are provided in the first layer of the power module 100.

Note that, in order to define the respective layers, a mounting surface of a power device is defined as the first layer, and the second layer and the third layer are defined in order of proximity to the first layer. Further, when the PGND is provided in portions of the first layer and the second layer immediately under the power circuit 1, current paths become antiparallel in the second layer and the third layer, so that it is possible to reduce parasitic inductance.

For example, in a case where a step-down chopper operation is performed, when the Hi-side power semiconductor 11H is turned on, a current flows in from the power terminal PT11, and flows from the power terminal PT13 toward a load via an inductor. The current further flows in from the load through the power terminal PT12, and finally flows out from the PGND2 of the power terminal PT14. In other words, such a structure is referred to also as a reflux structure. This makes it possible to reduce the above-described parasitic inductance.

Moreover, as illustrated in FIG. 2, a power terminal for external connection of the power circuit 1 may be formed into a shape in which the second layer a sectional area of which with respect to a flow passage of a current is large protrudes to an outside.

According to the aforementioned configuration, the configuration is provided so that a large current is able to flow to the power terminal for external connection and the CGND provided in the second layer is made thick, so that it is also possible to improve stability with respect to noise at the time of switching.

(Heat Radiation Plate)

As described above, in the present embodiment, the heat radiation plate 26 that is joined to a substrate of the power module 100 may be included so as to radiate heat generated by the power module 100 to an outside. In order to enhance heat conduction to the heat radiation plate 26, the number of substrate layers may be small, and, in order to suppress a rise in temperature of wires due to high current density in the power circuit, a thickness of the heat radiation plate 26 may be thick.

Moreover, a method of joining the heat radiation plate 26 and the substrate of the power module 100 is not particularly limited, and, for example, a method of adhesion with an adhesive may be adopted or screw fixation with a screw member or the like may be adopted.

In the power module 100 according to the present embodiment, the CGND and the PGND are insulated to suppress transfer of noise, which is generated due to the potential fluctuation of the PGND, to the control circuit 2 at the time of switching. Moreover, the configuration is provided so that the PGND does not overlap with the control circuit 2 in a region immediately under the control circuit 2.

Going back to FIGS. 1 to 3, description will be continued. As illustrated in FIG. 2, the control input circuit 21 and the PGND1 are arranged at respective positions not to face each other in different layers via an insulating member of the substrate.

Specifically, in FIG. 2, although the control input circuit 21 is provided in the first layer on a left side of the power module 100 in FIG. 2, among the PGNDs, at least the PGNDs in the second layer and the third layer are provided in the respective layers, which do not face the control output circuit 22, on a right side of the power module 100 in FIG. 2.

According to the aforementioned configuration, it is possible to more suitably suppress transfer of noise, which is generated due to the potential fluctuation of the PGND, to the control circuit at the time of switching.

Moreover, circles which are in both of right and left ends in FIG. 1 and each of which has a notch indicate vias through which wires arranged in the first to third layers are connected, and circles in a center part indicate vias through which wires arranged in the first and second layers are connected. Moreover, a region which includes the CGND and is constituted by a plurality of dots (•) indicates a portion in which similar patterns overlap in the second layer and the third layer.

A reference sign of 25 in FIG. 2 denotes a via through which wires arranged in the first to third layers are connected. A reference sign of 23 denotes solder by which the Hi-side gate driver 21H is joined to the CGND or the control output circuit 22.

Operation and Effect

As described above, in "GN001 Application Guide Design with GaN Enhancement mode HEMT" Updated on Apr. 12, 2018 GaN Systems Inc. (p. 40), the CGND is arranged immediately under the control input circuit and the PGND is arranged immediately under the control output circuit. Then, a verification about the power module 100 according to the present embodiment and related arts is conducted. Results are illustrated in FIGS. 4A to 4C.

Figure 4A:
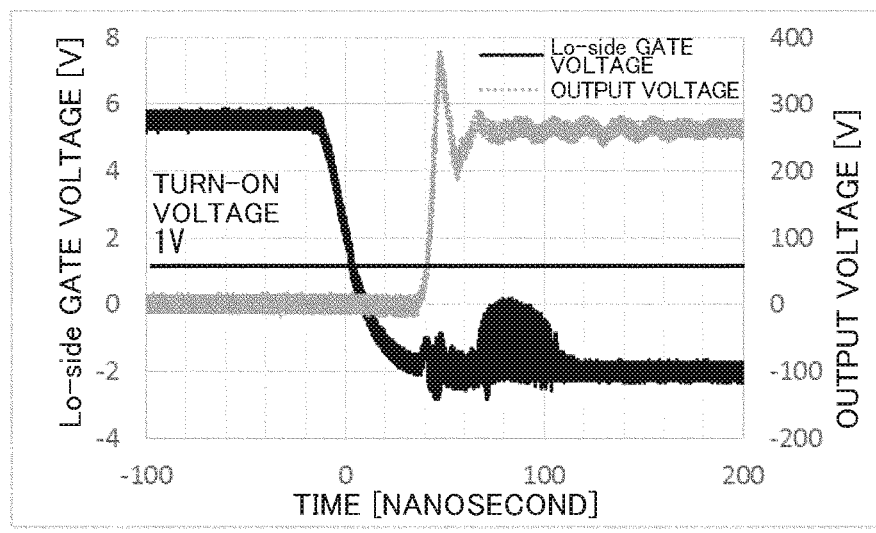
FIGS. 4A to 4C illustrate gate voltage waveforms of Embodiment 1 and related arts at a time of switching.
Figure 4B:
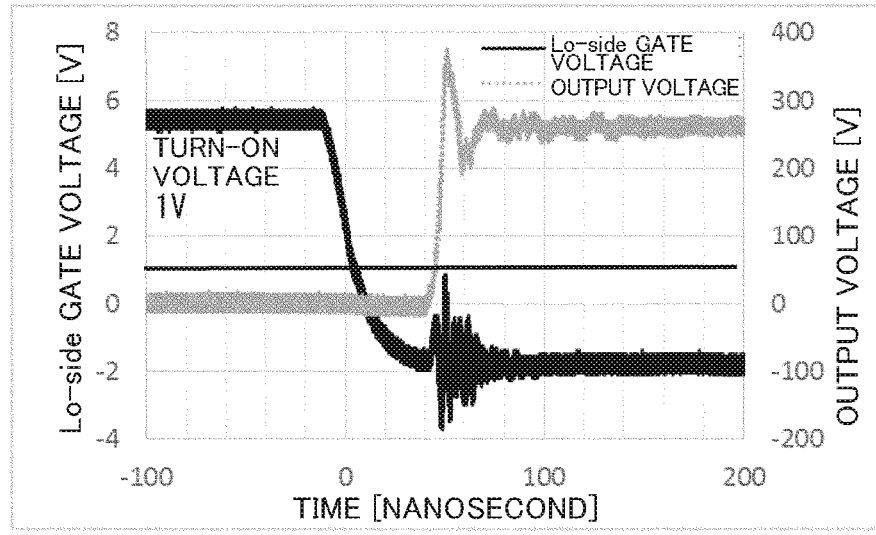
Figure 4C:
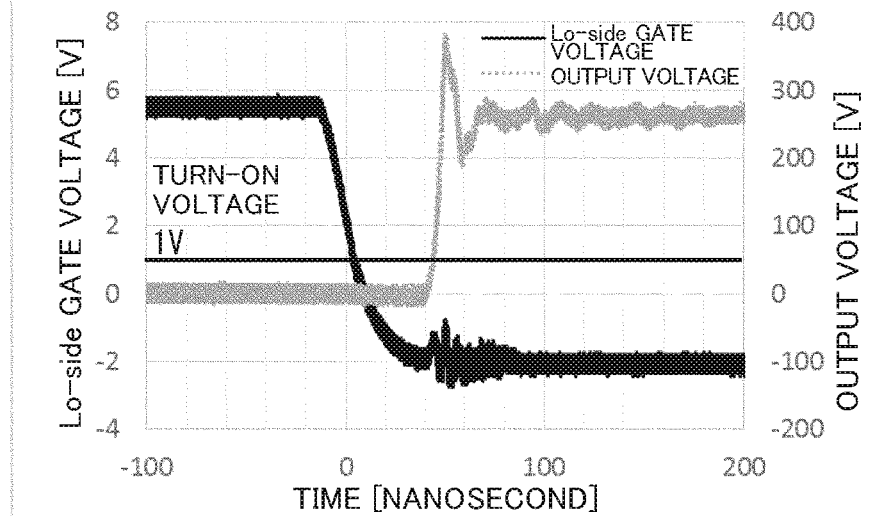

FIGS. 4A to 4C illustrate gate voltage waveforms of Embodiment 1 and the related arts at a time of switching. Moreover, description about verification conditions in FIGS. 4A to 4C and the figures are as follows.

Verification method: voltage measurement by an oscilloscope

Turn-on voltage: 1 V

Black solid line: a Lo-side gate output voltage at a time of turn-off of a Lo-side power semiconductor (PGND potential reference) (left axis)

Gray dotted line: an output voltage at a time of turn-off of a Lo-side "power semiconductor" and turn-on of a Hi-side "power semiconductor"

(PGND potential reference) (right axis)

An origin of time in a horizontal axis is set as timing when a Lo-side gate voltage falls below 2 V.

Verification Result Example 1

FIG. 4A illustrates a result of a case where a PGND and a CGND are separated and the PGND is arranged in a counter surface of a control input circuit and a control output circuit. As illustrated in FIG. 4A, noise generated due to potential fluctuation of the PGND due to switching applies noise also to the control output circuit via an insulating layer due to induced electromotive force. Thereafter, erroneous turn-on is caused by an output signal from a gate driving driver to which a signal including the noise has been input.

Further, in a case where a GaN device is used for a power semiconductor, a threshold voltage of turn-on, with which a transistor is switched ON from OFF, is about 1 V. In FIG. 4A, noise of about 2 V is successively generated from 70 nanoseconds to 110 nanoseconds, and there is risk that, when the noise further increases and exceeds a threshold, short-circuit is caused by erroneous turn-on and a module is damaged.

Moreover, in order to avoid erroneous turn-on, reference potential of the control output circuit needs to be lowered to −2 V or less with respect to potential of the PGND, so that loss is caused at a time of switching OFF and efficiency is deteriorated.

Verification Result Example 2

FIG. 4B illustrates a result of a case where a PGND and a CGND are separated, the CGND is arranged in a counter surface of a control input circuit, and the PGND is arranged in a counter surface of a control output circuit. As illustrated in FIG. 4B, noise is applied to the control output circuit from the PGND via an insulating layer due to induced electromotive force.

Moreover, in FIG. 4B, noise of about 3 V is generated around 50 nanoseconds, and there is risk that, when the noise exceeds a threshold, short-circuit is caused by erroneous turn-on and a module is damaged. Moreover, in order to avoid erroneous turn-on, reference potential of the control output circuit needs to be lowered to −2 V or less with respect to potential of the PGND, so that loss is caused at a time of switching OFF and efficiency is deteriorated.

Verification Result Example 3

As described above, FIG. 4C illustrates a result of a case where a PGND and a CGND are separated and the PGND is not included in a counter surface of a control output circuit. As illustrated in FIG. 4C, since potential fluctuation of the PGND due to switching does not affect the control output circuit, erroneous turn-on is not caused.

Further, since noise is about 1 V in FIG. 4C, possibility of erroneous turn-on is very slight. Moreover, with a noise level of the present configuration, there is possibility that reference potential of the control output circuit is able to be used without being lowered with respect to potential of the PGND, loss at a time of switching OFF is reduced and efficiency is able to be improved.

As above, in the verification result examples 1 and 2, since positional relationship between the control output circuit and the PGND is not considered, the potential fluctuation of the PGND affects not the CGND but the control output circuit. On the other hand, in the present embodiment, since the configuration in which the PGND does not overlap with the control circuit 2 in a region immediately under the control circuit 2 and the configuration in which at least a part of the control output circuit 22 of the control circuit 2 and the CGND are arranged at respective positions to face each other in different layers via the insulating layer 24 are used, it is possible to suppress transfer of noise, which is generated due to the potential fluctuation of the PGND, to the control output circuit 22 of the control circuit 2 at the time of switching.

Embodiment 2

Another embodiment of the disclosure will be described below. Note that, for convenience of description, a member having the same function as that of the member described in the aforementioned embodiment will be given the same reference sign, and description thereof will not be repeated.

Another Configuration Example of Power Module

FIG. 5 is an explanatory view illustrating a configuration example of a power module 100a according to the present embodiment, and FIG. 6 is a sectional view taken along a line VI-VI of FIG. 5. As illustrated in FIG. 6, in the present embodiment, substrate wiring of the power module 100a has, for example, a two-layer structure. The insulating layer 24 is provided in each space between layers.

Moreover, also in the present embodiment, in order to define the respective layers, the first layer and the second layer are defined in order from an upper side to a lower side in FIG. 6. Note that, as compared with Embodiment 1 described above, since the two-layer structure is provided in the present embodiment, a heat radiation property is able to be further improved.

Similarly to those of Embodiment 1 described above, in the power module 100a according to the present embodiment, the CGND and the PGND are insulated so that transfer of noise, which is generated due to the potential fluctuation of the PGND, to the control circuit 2 is suppressed. Moreover, a configuration is provided so that the PGND does not overlap with the control circuit 2 in a region immediately under the control circuit 2.

As illustrated in FIG. 5, in the power module 100a, the power circuit 1 includes, as the power semiconductors 11, a first power semiconductor 11H and a second power semiconductor 11L which are half-bridge connected. Moreover, a reference sign of 12 in FIG. 5 denotes the bypass capacitor.

In addition, the power circuit 1 further includes the first power terminal PT11, the second power terminal PT12, the third power terminal PT13, and the above-described bypass capacitor 12.

The first power terminal PT11 is connected to the drain electrode 11Hd of the first power semiconductor 11H via the first wire W12. The second power terminal PT12 is connected to the source electrode 11Ls of the second power semiconductor 11L via the second wire W34 that is parallel to the first wire W12 (also refer to FIG. 3). The bypass capacitor 12 connects the first wire and the second wire in a mounting direction to extend between the first wire and the second wire. The third power terminal PT13 is connected to the source electrode 11Hs of the first power semiconductor 11H and the drain electrode 11Ld of the second power semiconductor 11L.

As illustrated in FIG. 5, the power terminal for external connection of the power circuit 1 may be formed into a shape in which the second layer a sectional area of which with respect to a flow passage of a current is large protrudes to an outside.

According to the aforementioned configuration, the configuration is provided so that a large current is able to flow to the power terminals for external connection (PT12, PT13, and PT14) and also the CGND provided in the second layer is made thick, so that it is also possible to improve stability with respect to noise at the time of switching.

Here, as described above, the first power terminal PT11 and the second power terminal PT12 in the present embodiment respectively correspond to the first power terminal and the second power terminal in Embodiment 1.

As described above, according to the aforementioned configuration, in the present embodiment, it is possible to exert the following effect in addition to the operation and effect of Embodiment 1. That is, since it is possible to arrange the bypass capacitor 12 in a vicinity of the power semiconductor 11, drain inductance Ld is able to be made small. Accordingly, it is possible to reduce loss at a time of turn-on, thus making it possible to achieve improvement of power conversion efficiency.

(Power Circuit Unit)

Figure 7:
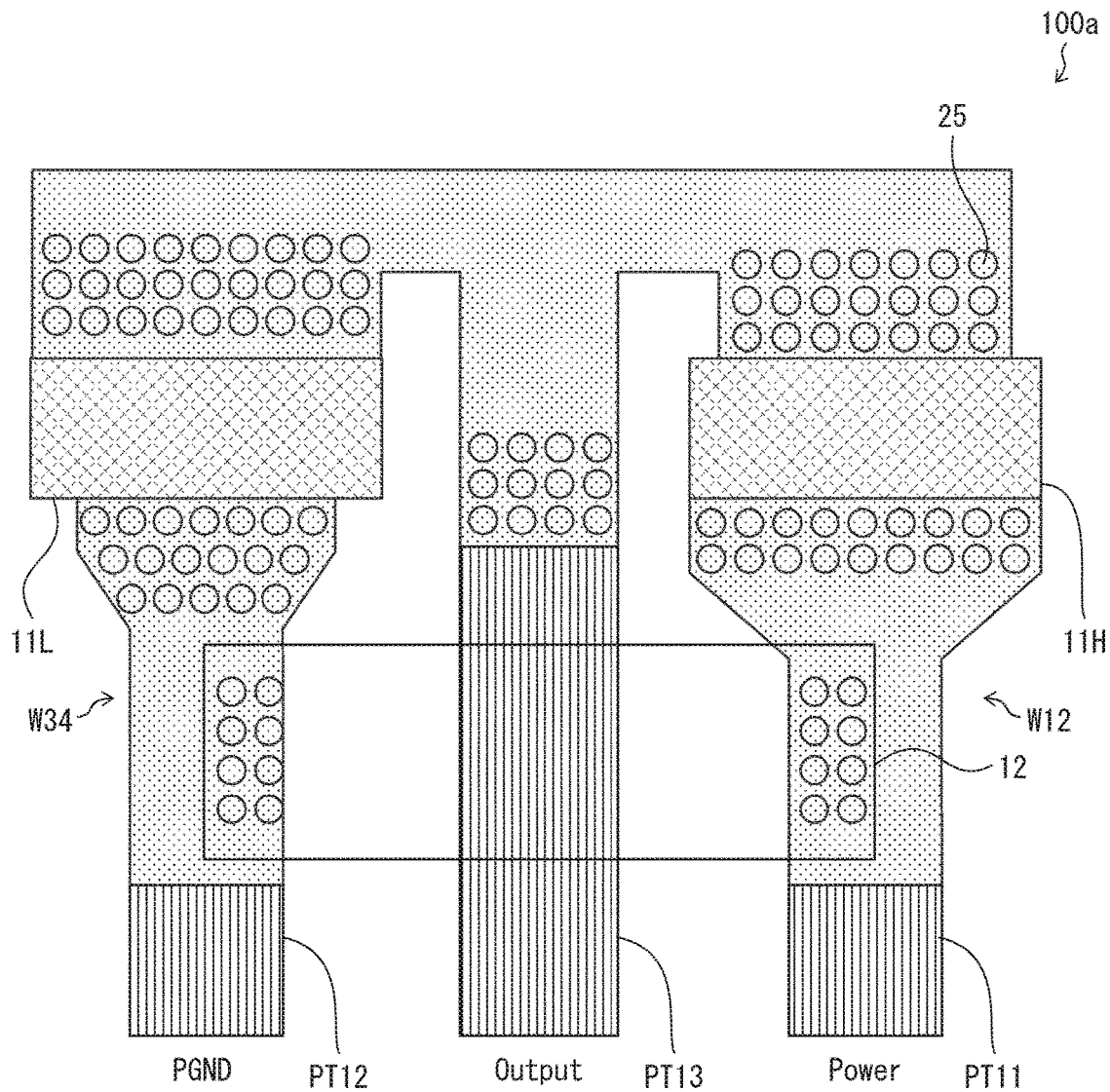
FIG. 7 illustrates a power circuit unit of the power module in FIG. 5.

FIG. 7 illustrates a power circuit unit of the power module 100a in FIG. 5. As illustrated in FIG. 7, in the power module 100a, the via 25 is arranged under a place at which the bypass capacitor 12 is arranged (also refer to FIG. 6).

Accordingly, it is possible to increase a ratio of a current passing through the bypass capacitor 12, so that it is possible to further improve a noise reduction effect. Furthermore, in order to improve current density of the bypass capacitor 12, a configuration in which a wiring width of a land portion of the bypass capacitor 12 is narrowed may be provided.

Moreover, in the present embodiment, a reflux structure is provided in the same plane (layer), so that it is possible to achieve an effect of reducing inductance.

Embodiment 3

Another embodiment of the disclosure will be described below. Note that, for convenience of description, a member having the same function as that of the member described in the aforementioned embodiments will be given the same reference sign, and description thereof will not be repeated.

Figure 8:
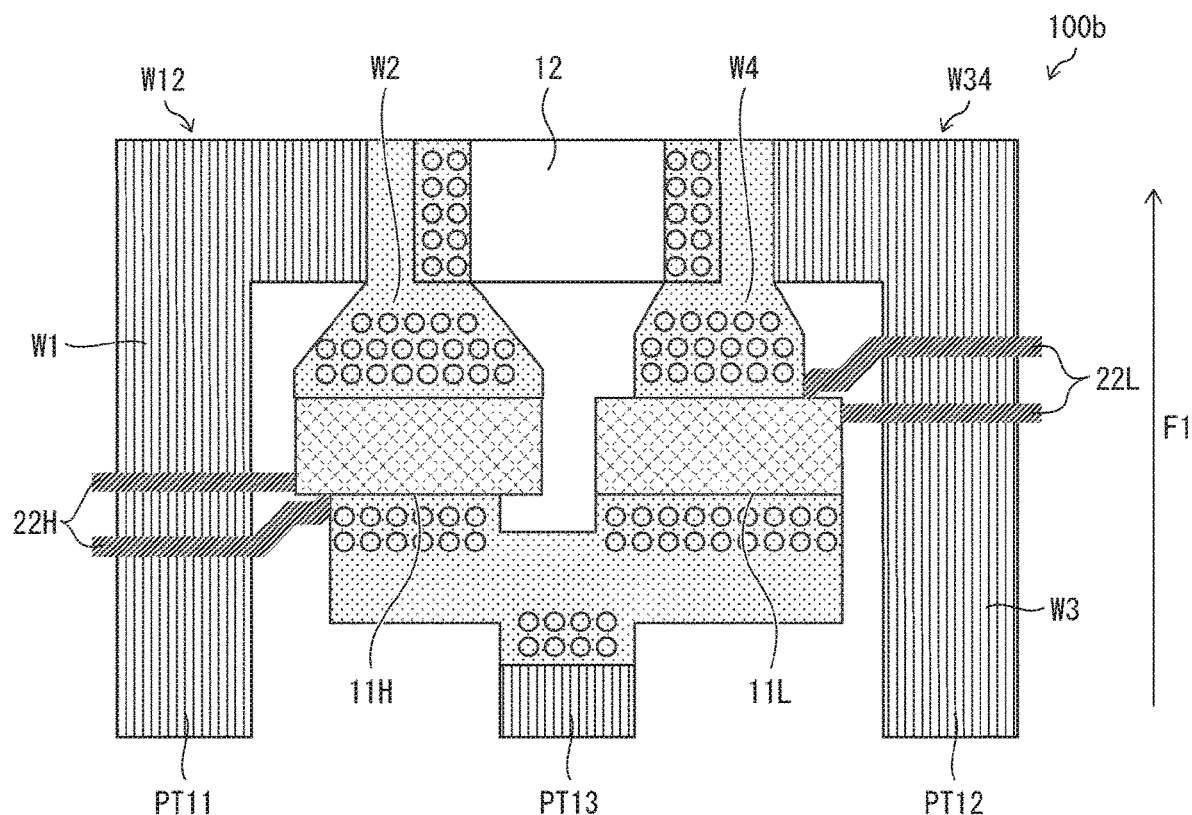
FIG. 8 is an explanatory view illustrating a configuration example of a power module according to Embodiment 3 of the disclosure.

FIG. 8 is an explanatory view illustrating a configuration example of a power module 100b according to the present embodiment. When the present embodiment is implemented, a "configuration of the power module that includes the PGND immediately under (just under) the control output circuit" is assumed.

In the present embodiment, the following configuration is provided.

In the power module 100b according to the present embodiment, the first wire W12 includes a first wire portion W1 and a second wire portion W2. The first wire portion W1 has one end connected to the first power terminal PT11, and extends from the first power terminal PT11 along a first direction F1. The second wire portion W2 is connected to the other end of the first wire portion W1, and extends from the other end toward the first power semiconductor 11H in a direction opposite to the first direction F1.

Moreover, the second wire W34 includes a third wire portion W3 and a fourth wire portion W4. The third wire portion W3 has one end connected to the second power terminal PT12, and extends from the second power terminal PT12 along the first direction F1. The fourth wire portion W4 is connected to the other end of the third wire portion W3, and extends from the other end toward the second power semiconductor 11L in the direction opposite to the first direction F1.

In this manner, with a folding structure of a power line, current paths become antiparallel, so that it is possible to further reduce inductance.

Note that, even when the PGND is arranged immediately under the control circuit 2, a shield pattern is provided therebetween. For example, a layer including the control circuit is set as the first layer and a layer including the second power terminal PT12 is set as the third layer, and the shield pattern is provided, for example, therebetween to provide a three-layer structure.

Note that, a predetermined distance is provided between patterns of the PGND and the control circuit 2 in a horizontal direction. For example, since the patterns of the control circuit 2 and the PGND function as a pair of capacitors in a vertical direction, electric field coupling is strong and noise easily has influence. However, the electric field coupling becomes weak in the horizontal direction, so that it is possible to suppress the influence of the noise to a certain extent when the patterns are separated by, for example, about 1.0 mm.

According to the aforementioned configuration, it is possible to separate the PGND and the CGND in terms of noise. That is, it is possible to exert an effect similar to that of Embodiments 1 and 2 described above.

Implementation Example by Software

A control block (particularly, the control circuit 2) of the power module 100 may be implemented by a logic circuit (hardware) formed in an integrated circuit (IC chip) or the like or may be implemented by software.

In the latter case, the power module 100 includes a computer that executes a command of a program that is software implementing each function. The computer includes, for example, at least one processor (control device) and at least one computer-readable recording medium that stores the program. When the processor reads the program from the recording medium and executes the program in the computer, the disclosure is implemented. As the processor, for example, a CPU (Central Processing Unit) is able to be used. As the recording medium, a "non-transitory tangible medium", for example, such as a tape, a disk, a card, a semiconductor memory, or a programmable logic circuit is able to be used in addition to a ROM (Read Only Memory) and the like. Moreover, a RAM (Random Access Memory), which develops the program, or the like may be further included. Further, the program may be supplied to the computer via any transmission medium (such as a communication network or a broadcast wave) which allows the program to be transmitted. Note that, an aspect of the disclosure can also be implemented in a form of a data signal in which the program is embodied through electronic transmission and which is embedded in a carrier wave.

CONCLUSION

A power module according to an aspect 1 of the disclosure includes: a power circuit that includes one or more power semiconductors; and a control circuit that supplies a gate signal to each of the one or more power semiconductors. The control circuit includes: one or more gate drivers which generate the gate signal in accordance with a control signal and in which a side to which the control signal is input and a side on which the gate signal is generated are insulated; a control input circuit to which the control signal is input and which supplies the control signal to the one or more gate drivers; and a control output circuit which supplies the gate signal to each of the power semiconductors. A ground of the power circuit and a ground of the control circuit are separated, and at least a part of the control output circuit of the control circuit and the ground of the control circuit are arranged at respective positions to face each other in different layers via an insulating layer.

According to the aforementioned configuration, it is possible to suppress transfer of noise, which is generated due to potential fluctuation of the ground of the power circuit, to the control circuit at a time of switching.

In the power module according to an aspect 2 of the disclosure, in the aspect 1, the control input circuit and the ground of the power circuit may be arranged at respective positions not to face each other in different layers.

In the power module according to an aspect 3 of the disclosure, in the aspect 1 or 2, substrate wiring of the power module may be constituted by three layers.

In the power module according to an aspect 4 of the disclosure, in the aspect 1 or 2, substrate wiring of the power module may be constituted by two layers.

In the power module according to an aspect 5 of the disclosure, in any one of the aspects 1 to 4, the power circuit may include, as the power semiconductors, a first power semiconductor and a second power semiconductor which are half-bridge connected, and the power circuit may further include a first power terminal that is connected to the first power semiconductor via a first wire, a second power terminal that is connected to the second power semiconductor via a second wire which is parallel to the first wire, a third power terminal that is connected to a source electrode of the first power semiconductor and a drain electrode of the second power semiconductor, and a bypass capacitor that connects the first wire and the second wire in a mounting direction to extend between the first wire and the second wire.

In the power module according to an aspect 6 of the disclosure, in the aspect 5, the first wire may include a first wire portion that has one end connected to the first power terminal and extends from the first power terminal along a first direction, and a second wire portion that is connected to the other end of the first wire portion and extends from the other end toward the first power semiconductor in a direction opposite to the first direction, and the second wire may include a third wire portion that has one end connected to the second power terminal and extends from the second power terminal along the first direction, and a fourth wire portion that is connected to the other end of the third wire portion and extends from the other end toward the second power semiconductor in the direction opposite to the first direction.

The power module according to an aspect 7 of the disclosure may further includes, in any one of the aspects 1 to 6, a heat radiation plate that is joined to a substrate of the power module.

The embodiments disclosed here are to be understood as being in all ways exemplary and in no ways limiting. The scope of the disclosure is defined not by the foregoing descriptions but by the appended claims, and is intended to include all changes equivalent in meaning and scope to the claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A power module comprising:
   a power circuit which includes one or more power semiconductors; and
   a control circuit which supplies a gate signal to each of the one or more power semiconductors, the control circuit including
      one or more gate drivers which generate the gate signal in accordance with a control signal and in which a side to which the control signal is input and a side on which the gate signal is generated are insulated,
      a control input circuit to which the control signal is input and which supplies the control signal to the one or more gate drivers, and
      a control output circuit which supplies the gate signal to each of the power semiconductors,
   wherein a ground of the power circuit and a ground of the control circuit are separated, and
   at least a part of the control output circuit of the control circuit and the ground of the control circuit are arranged at respective positions to face each other in different layers with an insulating layer interposed therebetween.

2. The power module according to claim 1, wherein the control input circuit and the ground of the power circuit are arranged at respective positions not to face each other in different layers.

3. The power module according to claim 1, wherein substrate wiring of the power module is constituted by three layers.

4. The power module according to claim 1, wherein substrate wiring of the power module is constituted by two layers.

5. The power module according to claim 1, wherein the power circuit includes,
- as the power semiconductors, a first power semiconductor and a second power semiconductor which are half-bridge connected, and the power circuit further includes
- a first power terminal connected to the first power semiconductor via a first wire,
- a second power terminal connected to the second power semiconductor via a second wire, the second wire being parallel to the first wire,
- a third power terminal connected to a source electrode of the first power semiconductor and a drain electrode of the second power semiconductor, and
- a bypass capacitor connecting the first wire and the second wire in a mounting direction to extend between the first wire and the second wire.

6. The power module according to claim 5, wherein the first wire includes
- a first wire portion including one end connected to the first power terminal and extending from the first power terminal along a first direction, and
- a second wire portion connected to another end of the first wire portion and extending from the other end toward the first power semiconductor in a direction opposite to the first direction, and the second wire includes
- a third wire portion including one end connected to the second power terminal and extending from the second power terminal along the first direction, and
- a fourth wire portion connected to another end of the third wire portion and extending from the other end toward the second power semiconductor in the direction opposite to the first direction.

7. The power module according to claim 1, further comprising a heat radiation plate on a substrate of the power module.

* * * * *